(12) United States Patent
Sreeramaneni et al.

(10) Patent No.: US 10,115,474 B1
(45) Date of Patent: Oct. 30, 2018

(54) ELECTRONIC DEVICE WITH A FUSE READ MECHANISM

(71) Applicant: Micron Technology, Inc., Boise, ID (US)

(72) Inventors: Raghukiran Sreeramaneni, Frisco, TX (US); William J. Wilcox, Meridian, ID (US); Girish N. Cherussery, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/814,835

(22) Filed: Nov. 16, 2017

(51) Int. Cl.
    *G11C 7/00* (2006.01)
    *G11C 17/18* (2006.01)
    *G11C 17/16* (2006.01)

(52) U.S. Cl.
    CPC ............. *G11C 17/18* (2013.01); *G11C 17/16* (2013.01)

(58) Field of Classification Search
    CPC .................. G11C 17/18; G11C 17/16

USPC ..................................................... 365/203, 96
See application file for complete search history.

(56) References Cited

U.S. PATENT DOCUMENTS

| 5,646,899 A * | 7/1997 | Jang ................. G11C 7/065 365/149 |
| 2010/0046306 A1* | 2/2010 | Takahashi ............ G11C 5/147 365/189.09 |
| 2011/0069570 A1* | 3/2011 | Katoch .............. G11C 11/4076 365/207 |
| 2013/0258789 A1* | 10/2013 | Takahashi ............ G11C 5/147 365/189.09 |

* cited by examiner

*Primary Examiner* — Vu Le
(74) *Attorney, Agent, or Firm* — Perkins Coie LLP

(57) ABSTRACT

A method of operating an electronic device includes: precharging a fuse read node to an intermediate voltage less than an input voltage, wherein the fuse read node connects a fuse array and a fuse read circuit, the fuse array including a fuse cell configured to store information and the fuse read circuit configured to read the stored information; connecting the fuse cell to the fuse read node for reading the information; and determining, with the fuse read circuit, the information from the fuse cell based on changes to the intermediate voltage at the fuse read node.

18 Claims, 6 Drawing Sheets

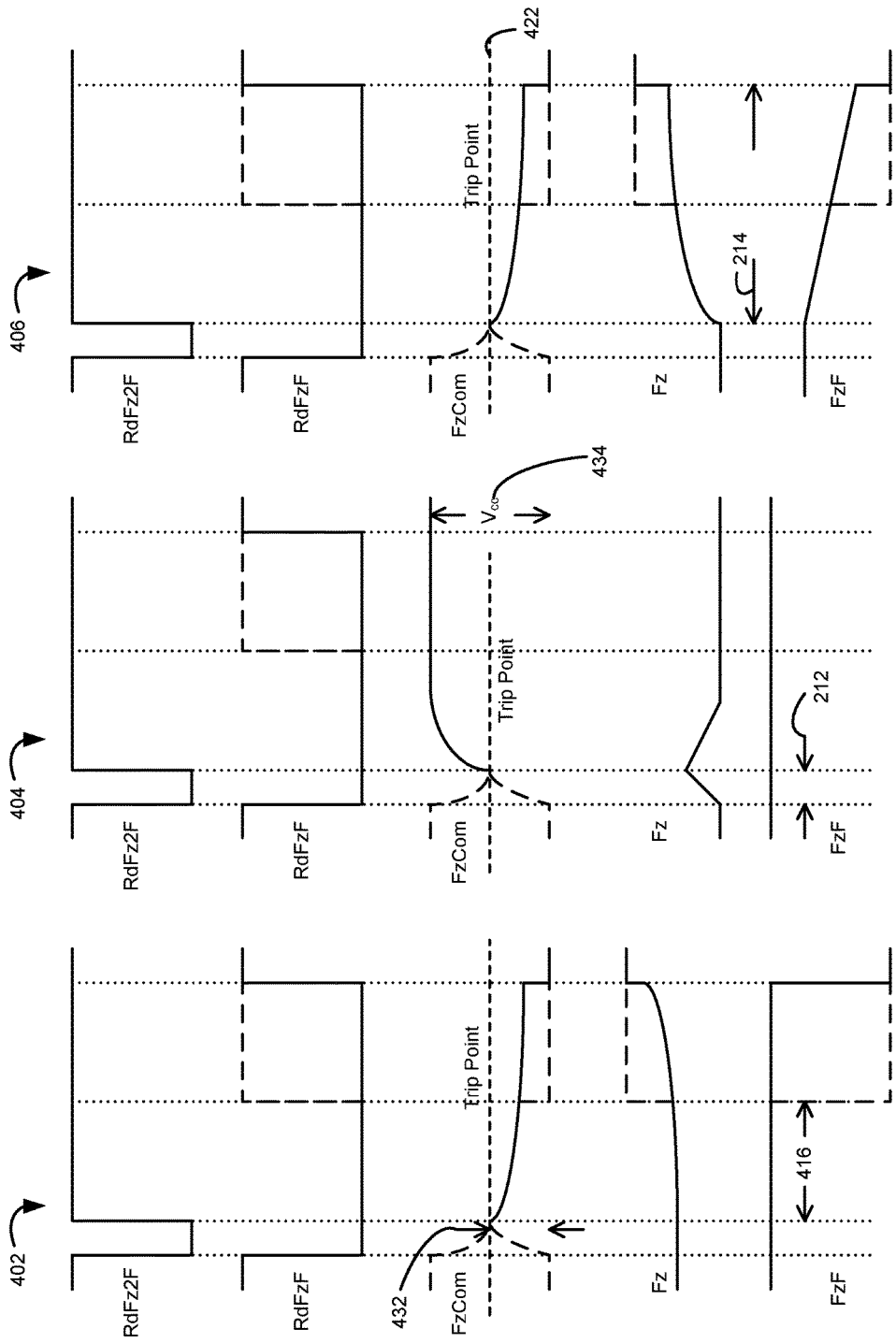

ELECTRONIC DEVICE WITH A FUSE READ MECHANISM

TECHNICAL FIELD

The disclosed embodiments relate to electronic devices, and, in particular, to semiconductor devices with a reading mechanism.

BACKGROUND

Electronic devices, such as semiconductor devices, memory chips, microprocessor chips, and imager chips, can include a set of fuses for storing information. For example, the electronic devices, such as semiconductor dies, can include one or more fuse arrays (e.g., a set or a network of fuses or anti-fuses that are programmed to store information). The electronic devices can include the one or more fuse arrays in a particular location (e.g., a central location), thereby replacing discrete fuses that were located throughout the device in other designs. The semiconductor die can read the information (e.g., redundancy information, wafer lot number, die lot number, die position on the wafer, etc.) from the fuse array and broadcast the information (e.g., based on communicating the information in a serial sequence), such as at device startup, initialization, or configuration.

FIG. 1 is an example circuit diagram of an electronic device 100 (e.g., a semiconductor die) including a fuse array and a fuse read circuit. The electronic device 100 can include one or more fuse arrays 102 that include multiple fuse cells 104 for storing information. For example, each of the multiple fuse cells 104 (e.g., for anti-fuses or gate oxide fuses) can include a setting circuit 108 (e.g., an oxide layer) that can be configured to represent information (e.g., for providing an open circuit when the cell is not programmed or for providing a short, such as through a weakened or damaged oxide layer, when the cell is programmed).

The electronic device 100 can use a fuse read circuit 120 to read the information stored in the one or more fuse arrays 102. To read the stored information, the selection circuit 110 can connect one or more fuse cells, an input source (e.g., a high-output bi-level power source or a variable analog power source) for providing an input power (e.g., '$V_{cc}$'), or a combination thereof to the fuse read circuit 120. For example, the electronic device 100 can precharge a fuse read-level 122 (e.g., a voltage level, represented as 'FzCom,' at a fuse read node 121 connecting the fuse read circuit 120 and the fuse array 102). When the setting circuit 108 is programmed or short, the fuse cell 104 can provide an electrical path (e.g., for dissipating the charge or to a lower potential node) to pull the fuse read-level 122 below the input source voltage. When the setting circuit 108 is not programmed or open, the fuse read node 121 can maintain the fuse read-level 122 at the input source voltage.

The fuse read circuit 120 can include a precharging transistor 124 that operates based on a precharging signal 126 (e.g., a gate voltage for the precharging transistor 124). The fuse read circuit 120 can use the precharging transistor 124 to precharge the fuse read-level 122 to the input source voltage for reading the information represented by the setting of the selected fuse cell. To precharge, the precharging transistor 124 can connect the input source to the fuse read node 121 based on the precharging signal 126.

FIGS. 2A-2C are timing diagrams illustrating the operation of a fuse read circuit. FIGS. 2A-2C illustrate timing of input signals and corresponding output signal behaviors under various programming conditions of the fuse cell 104 of FIG. 1 being read by the fuse read circuit 120 of FIG. 1. For example, FIG. 2A can illustrate a clearly-blown fuse profile 202, FIG. 2B can illustrate a unblown fuse profile 204, and the FIG. 2C can illustrate a weakly-blown fuse profile 206.

The electronic device 100 of FIG. 1 can read the programmed state (e.g., an unprogrammed state represented by an open circuit or a first resistance level, and a programmed state represented by a short circuit or a second resistance level lower than the first resistance level for anti-fuses) of the fuse cell 104 in the fuse array 102 of FIG. 1 using the fuse read circuit 120. The electronic device 100 (e.g., using the fuse read circuit 120, a control circuitry, etc.) can read the programmed state based on precharging the fuse read-level 122 of FIG. 1 at the fuse read node 121 of FIG. 1 (e.g., represented as 'FzCom' for FIGS. 2A-2C). To precharge the fuse read node 121, the fuse read circuit 120 can use the precharging signal 126 of FIG. 1, represented as 'RdFz2F,' to operate the precharging transistor 124 and connect or route the input source voltage ('$V_{cc}$') to the fuse read node 121. As illustrated in FIGS. 2A-2C, a negative pulse for the precharging signal 126 having a width of an enable duration 212 can operate the precharging transistor 124 and precharge the fuse read-level 122 to an input source level 234 (e.g., a voltage level of the selected power source/level, represented as '$V_{cc}$').

After the enable duration 212, the fuse read-level 122 can change or adjust based on the programming or setting of the fuse cell 104. For the fuse cell 104 that is clearly programmed as a blown state (e.g., with the setting circuit 108 of FIG. 1 providing relatively low resistance to ground '$V_{ss}$' or lower voltage node for anti-fuses), as illustrated by the clearly-blown fuse profile 202, the electrical charge or the voltage at the fuse read node 121 can dissipate through the relatively low resistive path through the fuse cell 104. Accordingly, the fuse read-level 122 can decrease over time after the enable duration 212.

For the fuse cell 104 that is clearly programmed as an unblown state (e.g., with the setting circuit 108 providing relatively high resistance to ground for anti-fuses), as illustrated by the unblown fuse profile 204, the electrical charge or the voltage at the fuse read node 121 can be retained or maintained since there is no path to dissipate the charge through the fuse cell 104. Accordingly, the fuse read-level 122 can remain at the input source level 234.

The fuse read circuit 120 can determine the setting or the programming of the selected fuse according to the fuse read-level 122 after a reading duration 214. For example, the read-lock signal 134 of FIG. 1 (e.g., represented as 'RdFzF' in FIGS. 2A-2C) can go low simultaneously with the precharging signal 126, and remain low for the reading duration 214 after the enable duration 212. During the reading duration 214, the fuse read-level 122 can adjust or settle based on the fuse setting as discussed above. The intermediate output (e.g., represented as 'Fz' in FIGS. 2A-2C) can behave complementary to the fuse read-level 122.

At the end of the reading duration 214, the read-lock signal 134 can go high and the fuse read circuit 120 can generate the fuse-read output based on the fuse read-level 122 and/or the intermediate output in relation to a reading threshold 222 (e.g., a threshold voltage level for distinguishing a low-voltage state corresponding to the blown state of the fuse from a high-voltage state corresponds to the unblown state). When the fuse read-level 122 is below the reading threshold 222 (e.g., as illustrated in FIG. 2A for the clearly-blown fuse profile 202), the fuse read circuit 120 can generate the fuse-read output representing the blown state of the corresponding fuse. When the fuse read-level 122 is above the reading threshold 222 (e.g., as illustrated in FIG. 2B for the unblown fuse profile 204), the fuse read circuit 120 can generate the fuse-read output 138 representing the unblown state of the corresponding fuse. For example, the fuse-read output 138 can be asserted high during the enable duration 212 and the reading duration 214, and then asserted low after the read-lock signal 134 goes high if warranted.

Fuse cell programming can result in a variety of settings or effects on the setting circuit 108, and some fuses result in a weakly-blown state. The fuse read-level 122 and the corresponding results can be illustrated in FIG. 2C with the weakly-blown fuse profile 206. For the weakly-blown fuse, the fuse read-level 122 can behave similar to other fuses during the enable duration 212. However, since the weakly blown setting of the setting circuit 108 provides higher resistance than the clearly blown fuses, the fuse read-level 122 decreases at a slower rate than clearly blown fuses. At the end of the enable duration 212, the fuse read-level 122 can still be greater than the reading threshold 222, which can lead to an erroneous value for the fuse-read output 138 (e.g., the fuse-read output 138 is in high voltage state when the fuse was intended to represent a blown state).

BRIEF DESCRIPTION OF THE DRAWINGS

FIGS. 4A-4C are timing diagrams of an electronic device with a reading mechanism in accordance with an embodiment of the present technology.

DETAILED DESCRIPTION

The technology disclosed herein relates to electronic devices (e.g., semiconductor-level devices, sets of analog circuitry components, etc.), systems with electronic devices, and related methods of operation or manufacture for the electronic devices in association with fuse read circuits for reading information programmed in fuse cells (e.g., anti-fuses). The electronic devices can include fuse read circuits configured to read information stored in the fuse cells based on precharging fuse read nodes of the read circuits to an intermediate voltage level lower than an input source level. In some embodiments, the fuse read circuits can precharge to the intermediate level that is same as or within a threshold range from a reading threshold used to distinguish the voltage levels corresponding to different programming states.

In some embodiments, the fuse read circuits can use intermediate precharging devices (e.g., inverters with their input and output tied to the fuse read nodes) instead of precharging transistors to precharge the fuse read nodes to the intermediate level. In some embodiments, the fuse read circuits can read the information stored in the corresponding fuse based on adjusting the fuse read-level during an updated duration that is lower than a reading duration associated with precharging the fuse read nodes to the input source level.

Figure 3A:
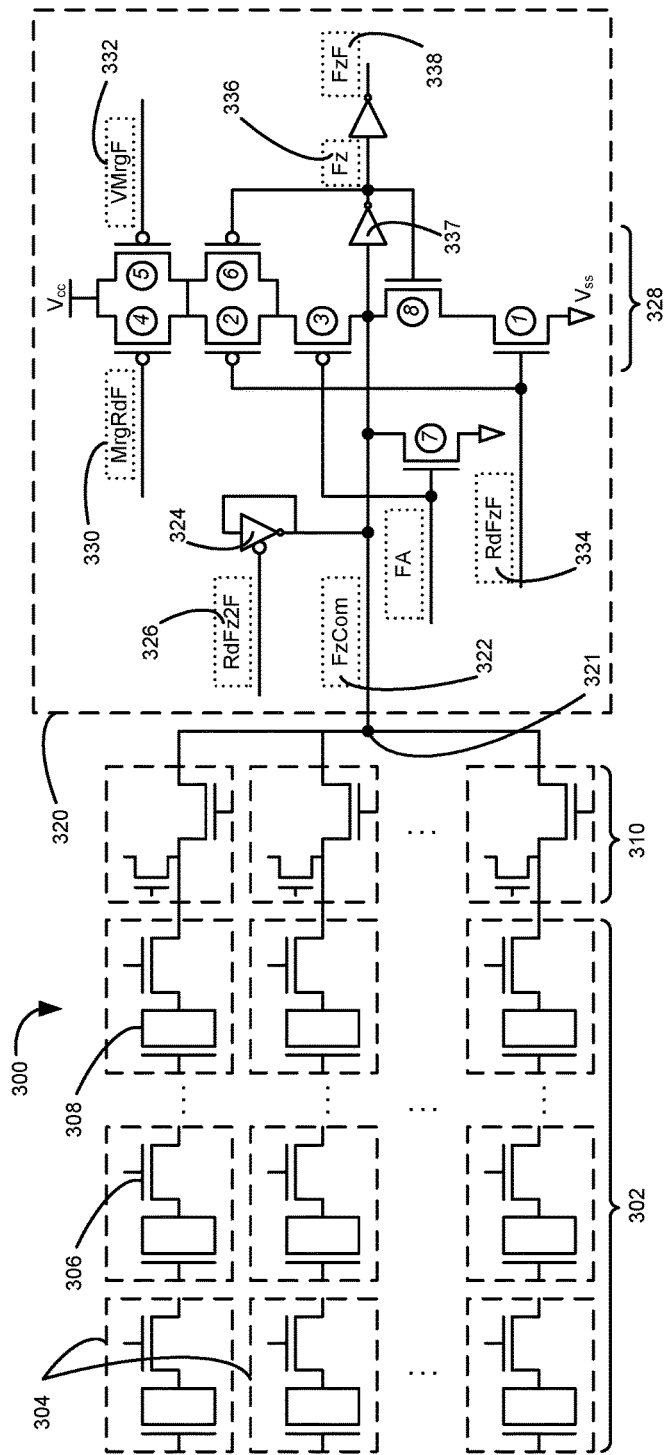
FIG. 3A is a circuit diagram of an electronic device with a reading mechanism in accordance with an embodiment of the present technology.

FIG. 3A is a circuit diagram of an electronic device 300 (e.g., a semiconductor die) with a reading mechanism in accordance with an embodiment of the present technology. The electronic device 300 can include one or more fuse arrays 302 that include multiple fuse cells 304 for storing information. The fuse arrays 302 can each include one or more sets of the fuse cells 304 (e.g., anti-fuses or gate oxide fuses) that are physically located at a specific portion of the electronic device 300 (e.g., at a central or dedicated portion within the die).

In some embodiments, each of the multiple fuse cells 304 (e.g., for anti-fuses or gate oxide fuses) can include a fuse transistor 306 for selecting the particular fuse cell and a setting circuit 308 (e.g., an oxide layer) that can be configured to represent information (e.g., for providing an open circuit when the cell is not programmed or for providing a short, such as through a weakened or damaged oxide layer, when the cell is programmed). For example, the setting circuit 308 can provide an electrical open or a first resistance level (e.g., relative to another node or ground ('$V_{cc}$')) when the fuse is not programmed. When the fuse is programmed or configured to a blown setting, the setting circuit 308 can provide an electrical short or a second resistance level that is lower than the first resistance level (e.g., based on intentionally damaging the oxide layer).

The electronic device 300 can use a selection circuit 310 (e.g., a set of switches) to connect one or more targeted fuse cells to a fuse read circuit 320 to read the information stored in the one or more fuse arrays 302 (e.g., based on detecting the programmed setting of the fuse). The selection circuit 310 can further connect an input source (e.g., a high-output bi-level power source or a variable analog power source) for providing an input power (e.g., '$V_{cc}$'). For example, the selection circuit 310 and/or the fuse transistor 306 can route the input power to the selected instance of the fuse cell 304, and the fuse read circuit 320 can read a fuse read-level 322 (e.g., a voltage level at a fuse read node 321, represented as 'FzCom') resulting from a setting of the connected fuse cell. The fuse read node 321 can be the electrical connection between the fuse array 302 and the fuse read circuit 320. When the setting circuit 308 is programmed or short, the fuse cell 304 can pull a voltage at the fuse read node 321 (e.g., a node connecting the fuse array 302 and/or the fuse cells with the fuse read circuit 320) below the input source voltage. When the setting circuit 308 is not programmed or open, the fuse cell 304 can maintain the input source voltage at the fuse read node 321.

Figure 1:
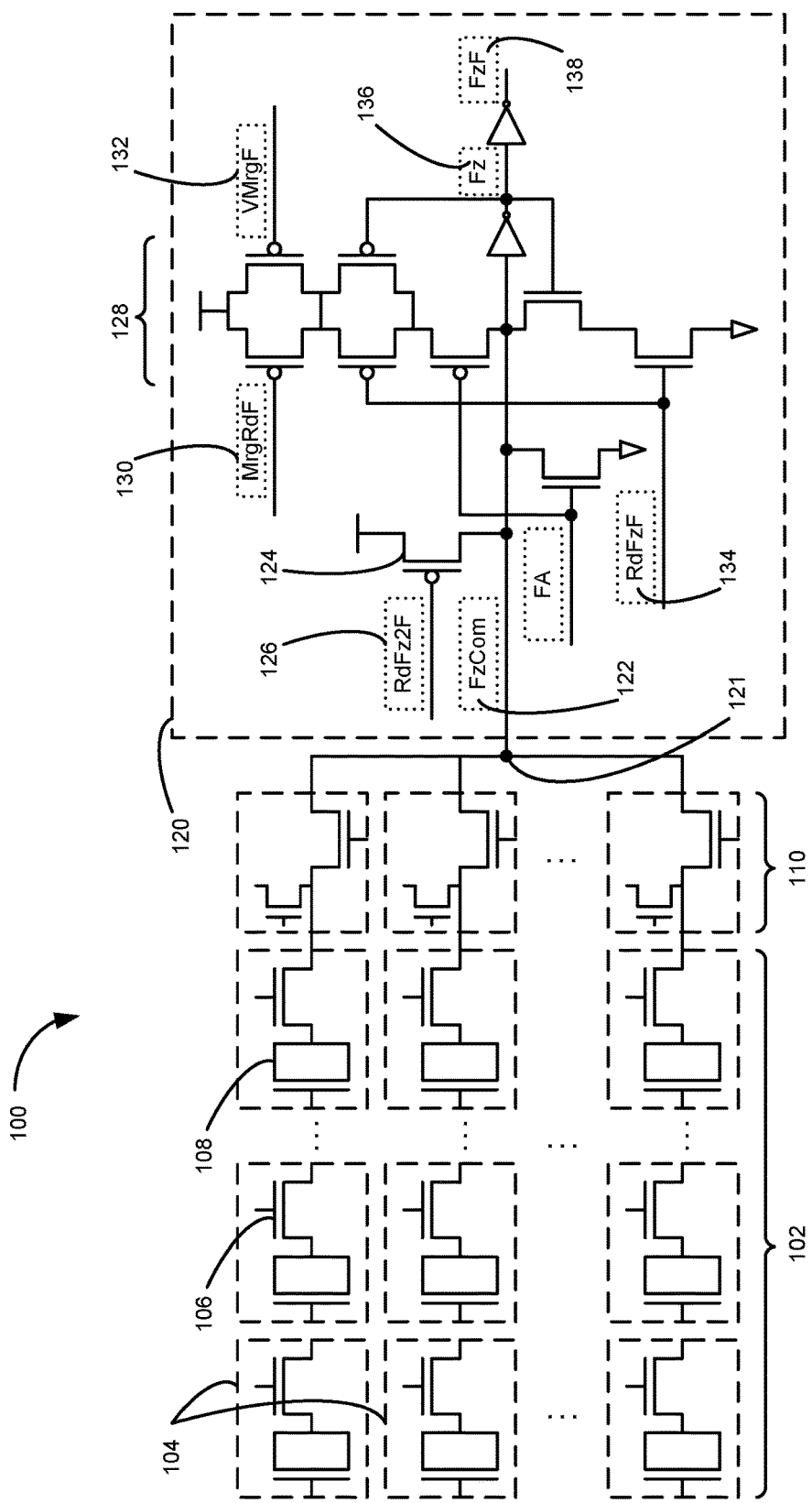
FIG. 1 is an example circuit diagram of an electronic device including a fuse array and a fuse read circuit.

The fuse read circuit 320 can further include an intermediate precharging device 324 (e.g., an inverter), instead of the precharging transistor 124 of FIG. 1, that operates based on a precharging signal 326 (e.g., a reference input to the inverter that functions as a target voltage and/or a voltage source). For example, the inverter can have an input and an output tied to the fuse read node 321. Based on the precharging signal 326 (e.g., with magnitude or voltage level at or near the reading threshold 222 of FIG. 2), the intermediate precharging device 324 can precharge the fuse read-level 322 (e.g., based on inverting the input and output until the voltage level at the two ports are equal and stable at a level of the precharging signal 326 or within a threshold range thereof) for reading the information represented by the setting of the selected fuse cell. Based on the precharging signal 326, the intermediate precharging device 324 can precharge the fuse read-level 322 to an intermediate voltage level (e.g., at or near the reading threshold 222) that is less than the input source voltage.

In some embodiments, the fuse read circuit 320 can include an input selection transistors 328 configured to select an input power source or the input source level. For example, the fuse read circuit 320 can use a high-input selection signal 330 (e.g., represented as 'MrgRdF') to select a target voltage level and/or a binary power source for strongly turning on a P channel that can counter act the short through the setting circuit 308. The fuse read circuit 320 can use the high-input selection signal 330 to read or test clearly blown fuses (e.g., corresponding to a resistance level close to an electrical short). For weakly blown fuses (e.g., corresponding to a resistance level that is above the electrical short but less than an open circuit level), the fuse read circuit 320 can use a granular-input selection signal 332 to select a lower voltage level and/or an analog variable power source for weakly turning on the P channel and providing a voltage level lower than the target voltage level.

The fuse read circuit 320 can further utilize additional devices/circuits (e.g., NMOS and/or PMOS transistor devices, inverters, or a combination thereof) to read the information stored in the fuse cell 304. For example, the additional devices/circuits can operate according to a read-lock signal 334 (e.g., represented as 'RdFzF') for locking or stabilizing the fuse read-level 322 and for generating an intermediate output 336 (e.g., represented as 'Fz' and corresponding to an intermediate inverter 337) based on the fuse read-level 322. The fuse read circuit 320 can further utilize additional devices/circuits to stabilize or isolate the fuse read-level 322, the intermediate output 336, or a combination thereof from other influences (e.g., latch behavior of the circuit) and generate a fuse-read output 338 (e.g., represented as 'FzF'). The fuse-read output 338 can represent a result generated by the fuse read circuit 320 from reading the information in the fuse cell 304.

Figure 3B:
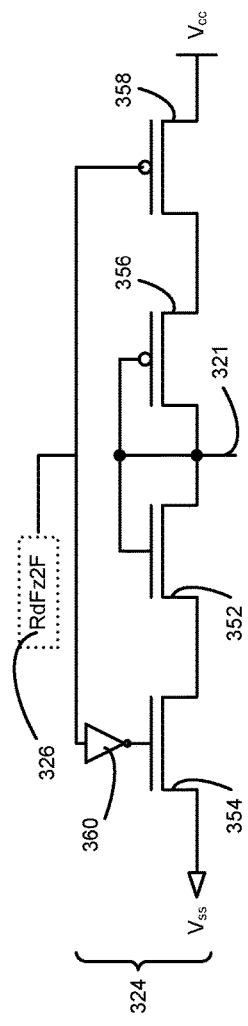
FIG. 3B is an example circuit diagram of a precharging device in accordance with an embodiment of the present technology.

FIG. 3B is an example circuit diagram of a precharging device in accordance with an embodiment of the present technology. The example circuit diagram can illustrate an embodiment of the intermediate precharging device 324 (e.g., an inverting circuitry).

In some embodiments, the intermediate precharging device 324 can include a first device 352 (e.g., a transistor, such as an NMOS device), a second device 354 (e.g., a transistor, such as an NMOS device), a first complementary device 356 (e.g., a complementary transistor, such as a PMOS device), a second complementary device 358 (e.g., a complementary transistor, such as a PMOS device), an inverter 360, or a combination thereof. The gates of the first NMOS 352 and the first PMOS 356, the source of the first PMOS 356 and the source of the NMOS 352, or a combination thereof can be connected together (e.g., direct connection) for or at the fuse read node 321. The drain of the second PMOS 358 can be connected to the input supply (e.g., for supplying $V_{cc}$), and the source of the second PMOS 358 can be connected to the drain of the first PMOS 356. The drain of the second NMOS 354 can be connected to electrical ground or a node with lower voltage potential, and the source of the second NMOS 354 can be connected to the drain of the first NMOS 352. The gate of the second PMOS 358 can be connected to receive the precharging signal 326. The inverter 360 can be connected to receive and invert the precharging signal 326. The inverter 360 can further be connected to the gate of the second NMOS 354 for supplying the inverted form of the precharging signal 326.

FIGS. 4A-4C are timing diagrams of an electronic device with a reading mechanism in accordance with an embodiment of the present technology. FIGS. 4A-4C illustrate timing of input signals and corresponding output signal behaviors under various programming conditions of the fuse cell 304 of FIG. 3 being read by the fuse read circuit 320 of FIG. 3 including the intermediate precharging device 324 of FIG. 3 (e.g., an inverter) configured to precharge the fuse read-level to an intermediate level that is less than the input voltage. For example, FIG. 4A can illustrate a clearly-blown fuse profile 402, FIG. 4B can illustrate a unblown fuse profile 404, and the FIG. 4C can illustrate a weakly-blown fuse profile 406.

The electronic device 300 of FIG. 3 can read the programmed state (e.g., an unprogrammed state represented by an open circuit or a first resistance level, and a programmed state represented by a short circuit or a second resistance level lower than the first resistance level for anti-fuses) of the fuse cell 304 in the fuse array 302 of FIG. 3 using the fuse read circuit 320. For the reading operation, the electronic device 300 can connect the fuse read circuit 320 to the selected cell using the fuse transistor 306 of FIG. 3, the selection circuit 310 of FIG. 3, or a combination thereof.

To read the information stored in the connected fuse cell, the fuse read circuit 320 can use the read-lock signal 334 of FIG. 3 for controlling (e.g., for initiating precharging operations and for triggering a read determination) the reading operations. The fuse read circuit 320 can further use the precharging signal 326 of FIG. 3, represented as 'RdFz2F,' to operate the intermediate precharging device 324 for precharging the fuse read-level 322 of FIG. 3 at the fuse read node 321 of FIG. 3 (e.g., voltage at the fuse read node 321 or the fuse read-level 322, represented as 'FzCom' for FIGS. 4A-4C).

Based on the precharging signal 326, the intermediate precharging device 324 can precharge the fuse read-level 322 of FIG. 3 to an intermediate level 432 that is less than an input source level 434. For example, during the enable duration 212, the intermediate precharging device 324 can precharge the fuse read node 321 to the intermediate level 432 associated with the precharging signal 326. In some embodiments, the precharging signal 326, the intermediate level 432, or a combination thereof can be the same as or within a threshold range from a reading threshold 422 (e.g., a threshold voltage level for distinguishing a low-voltage state corresponding to the blown state of the fuse from a high-voltage state corresponds to the unblown state).

After the enable duration 212, the fuse read-level 322 can change or adjust based on the programming or setting of the fuse cell 304. For the fuse cell 304 that is clearly programmed as a blown state (e.g., with the setting circuit 308 of FIG. 3 providing relatively low resistance to ground '$V_{cc}$' or lower voltage node for anti-fuses), as illustrated by the clearly-blown fuse profile 402, the electrical charge or the voltage at the fuse read node 321 can dissipate through the relatively low resistive path through the fuse cell 304. Accordingly, the fuse read-level 322 can decrease over time after the enable duration 212 to a voltage level below the intermediate level 432 (e.g., below the reading threshold 422).

For the fuse cell 304 that is clearly programmed as an unblown state (e.g., with the setting circuit 308 providing relatively high resistance to ground for anti-fuses) as illustrated by the unblown fuse profile 404, the electrical charge or the voltage at the fuse read node 321 can accumulate or increase based on the input source selected according to the high-input selection signal 330 of FIG. 3 or the granular-input selection signal 332 of FIG. 3. The electrical charge or the voltage at the fuse read node 321 can further accumulate or increase above the intermediate level 432 (e.g., above the reading threshold 422) since there is no path to dissipate the charge through the fuse cell 304.

The intermediate output 336 of FIG. 3 (e.g., represented as 'Fz' in FIGS. 4A-4C) can behave complementary to the fuse read-level 322. For example, for the clearly-blown fuse profile 402, the intermediate output 336 can increase over time as the fuse read-level 322 decreases (e.g., at a rate corresponding to the dissipation of the charge through the fuse cell 104). Also for example, for the clearly unblown fuse profile 404, the intermediate output 336 can remain low.

The fuse read circuit 320 can determine the setting or the programming of the selected fuse according to the fuse read-level 322 after an updated duration 416 that is same as or less than the reading duration 214 (e.g., a duration associated with discharging from the input source level 434). For example, the read-lock signal 334 of FIG. 3 (e.g., represented as 'RdFzF' in FIGS. 4A-4C) can go low simultaneously with the precharging signal 326, and remain low for the updated duration 416 after the enable duration 212. During the updated duration 416, the fuse read-level 322 can adjust or settle based on the fuse setting as discussed above.

At the end of the updated duration 416, the read-lock signal 334 can go high. Based on the read-lock signal 334 going high, the fuse read circuit 320 can generate the fuse-read output 338 of FIG. 3 based on a comparison between the fuse read-level 322 and the reading threshold 422. When the fuse read-level 322 is below the reading threshold 422 at the end of the reading duration 214 (e.g., as illustrated in FIG. 4A for the clearly-blown fuse profile 402), the fuse read circuit 320 can generate the fuse-read output 338 as a low voltage signal representing the blown state of the corresponding fuse. When the fuse read-level 322 is above the reading threshold 422 at the end of the reading duration 214 (e.g., as illustrated in FIG. 4B for the unblown fuse profile 404), the fuse read circuit 320 can generate the fuse-read output 338 as a high voltage signal representing the unblown state of the corresponding fuse.

Figures 2A, 2B, 2C:
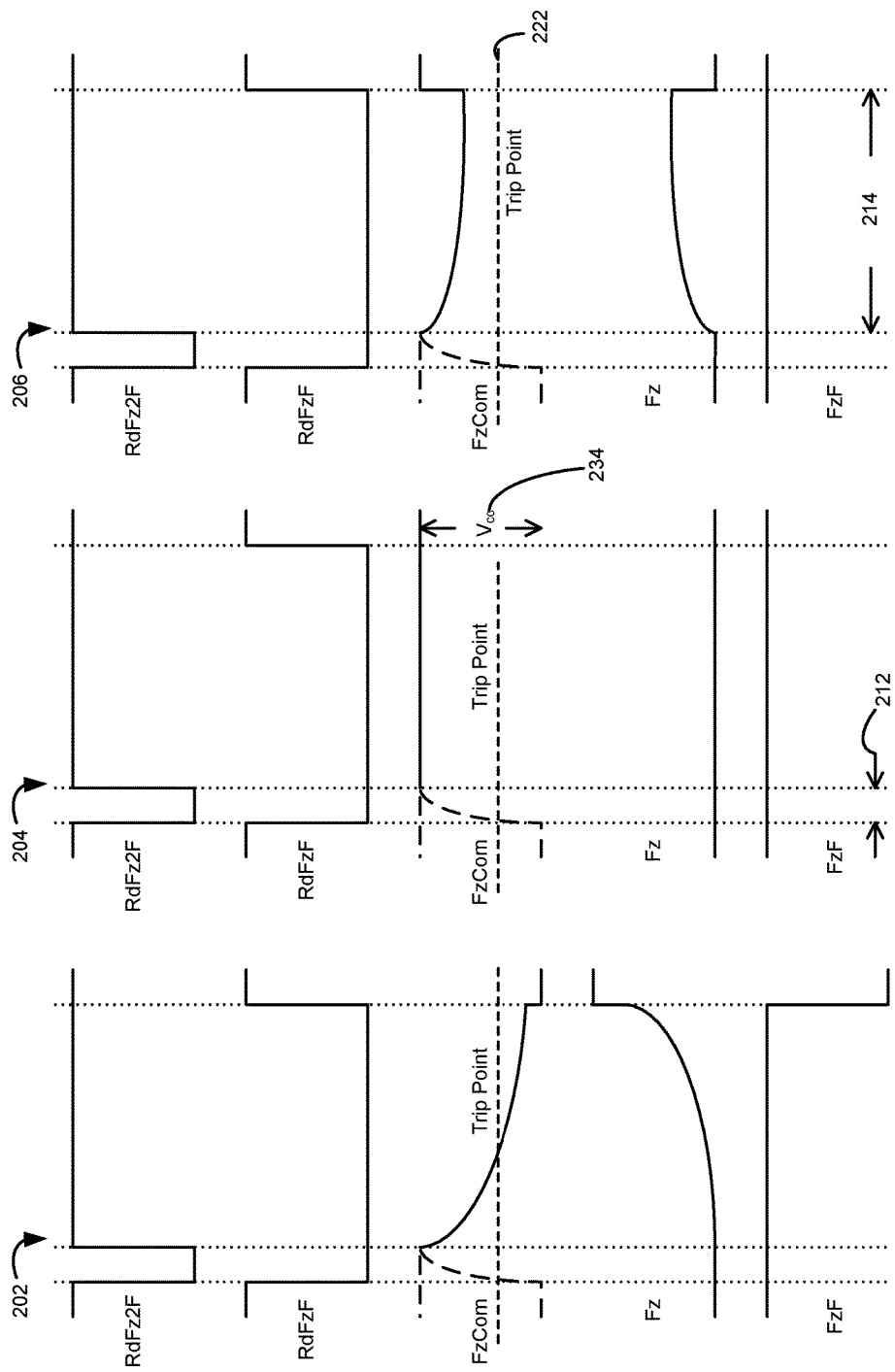
FIGS. 2A-2C are timing diagrams illustrating the operation of a fuse read circuit.

Since the discharging and/or the charging operation after the enable duration 212 starts from the intermediate level 432 that is at or near the reading threshold 422, the fuse read-level 322 can deviate from the reading threshold 422 in shorter time than starting from the input source level 234 (e.g., in comparison to FIGS. 2A-2C). As such, the fuse read circuit 320 can use less time (e.g., based on the updated duration 416 that is shorter than the reading duration 214 associated with discharging from or charging up to the input source level 234) to read the fuse cell 304 and provide decreased processing duration (e.g., time needed to read and broadcast the fuse settings) based on precharging to the intermediate level 432 instead of the input source level 434.

For fuses that are weakly-blown, such as for the weakly-blown fuse profile 406 illustrated in FIG. 4C, the fuse read-level 322 can still be below the reading threshold 422. Even if the unintended resistance level (e.g., higher than the intended resistance of the clearly blown fuses) causes the fuse read-level 322 to decrease at a slower rate than clearly blown fuses, the fuse read-level 322 can still be below the reading threshold 422 after the updated duration 416 since the starting point (e.g., the precharged level) was at or near the reading threshold 422. As such, precharging the fuse read node 321 to the intermediate level 432 that is less than the input source level 434 (e.g., at or within a threshold range from the reading threshold) decreases fuse-read errors.

Further, using the intermediate precharging device 324 instead of the precharging transistor 124 (e.g., any transistor or device tying the node to $V_{cc}$) to precharge the fuse read node 321 provides decreased processing time and the decreased fuse-read errors. The intermediate precharging device 324 (e.g., an inverter with its input and output tied to the fuse read node 321) can enable the fuse read circuit 320 to precharge the fuse read node 321 to the intermediate level 432 less than the input source level 434.

Moreover, precharging to the intermediate level 432 that is less than the input source level 434 (e.g., using the intermediate precharging device 324 instead of the precharging transistor 124) provides reduced load capacitances on the fuse read node 321, which can improve the fuse reading times (e.g., from the reading duration 214 to the updated duration 416). Due to shared fuse read circuit, the fuse read nodes in the fuse read circuit tend to have higher parasitic capacitance relative to discrete fuse schemes. This can cause the fuse-read operation to take a longer time to stabilize than in discrete fuse schemes. The fuse read circuit 320 can minimize the impact of the gut node capacitance and increase the fuse read speeds without hurting accuracy or performance based on precharging to the intermediate level 432.

Also, precharging to the intermediate level 432 can allow larger array mats to share a read circuit and improve the footprint of the fuse read circuit 320. The faster reading time can allow the fuse array 302 to grow in size, thereby removing the need for additional arrays and corresponding read circuits.

As an illustrative example, the fuse read-level 322 can become the intermediate level 432 (e.g., to a level less than '$V_{cc}$' that is targeted during precharging operations in other electronic devices, such as the electronic device 100 of FIG. 1) at or during the enable duration 212. At this time, the read-lock signal 334, the FA signal, the precharging signal 326, or a combination thereof can be low, and devices 1 and 7 (e.g., NMOS transistors, such as illustrated in FIG. 3A) can be off. Devices 3 and 2 (e.g., PMOS transistors, such as illustrated in FIG. 3A) can be on during the enable duration 212. Devices 4 and 5 (e.g., PMOS transistors, such as illustrated in FIG. 3A) can be "weak" transistors that are configured to provide a "weak" pull-up (e.g., in comparison to other devices in the fuse read circuit 320), and can be on during the enable duration.

During the enable duration 212, a connected blown fuse (e.g., as illustrated in FIG. 4B) can pull the fuse read-level 322 toward electrical ground (e.g., '$V_{ss}$') while devices 4 and 5 pull the fuse read level 322 up towards the input source level 434 at the same time, effectively forming a voltage divider network. The intermediate precharging device 324 can be stronger in comparison to devices 4 and 5 and can overwhelm the pull-up current corresponding to devices 4 and 5, the pull-down current corresponding to the fuse (e.g., when the fuse is blown), or a combination thereof. Accordingly, the intermediate precharging device 324 can precharge fuse read-level 322 at or close to the trip point (e.g., the reading threshold 422) of the intermediate inverter 337 of FIG. 3A. In some embodiments, the intermediate precharging device 324 can be configured to have a trip point close to that of the intermediate inverter 337.

After the enable duration 212 (e.g., initial part of the reading duration 214, such as during the updated duration 416), the read-lock signal 334, the FA signal, or a combination thereof can be low, and the precharging signal 326 can be high. During this time, devices 1 and 7 can remain off, devices 2 and 3 can remain on, or a combination thereof. Devices 4 and 5 can also remain on and provide a weak pull-up. The intermediate precharging device 324 can turn off, which can allow the interaction between the fuse pull-down effect (e.g., based on a blown fuse) and the weak pull-up effect (e.g., based on devices 4 and 5) to stabilize.

After the initial portion of the reading duration 214 (e.g., after the updated duration 416), the FA signal can be low, and the read-lock signal 334, the precharging signal 326, or a combination thereof can be high. During this time, device 7 can be off. Device 1 can turn on and device 2 can turn off. The operations can lock the data (e.g., based on latching the data through the feedback from devices 6 and 8). The locked data can correspond to the fuse-read output 338.

Figure 5:
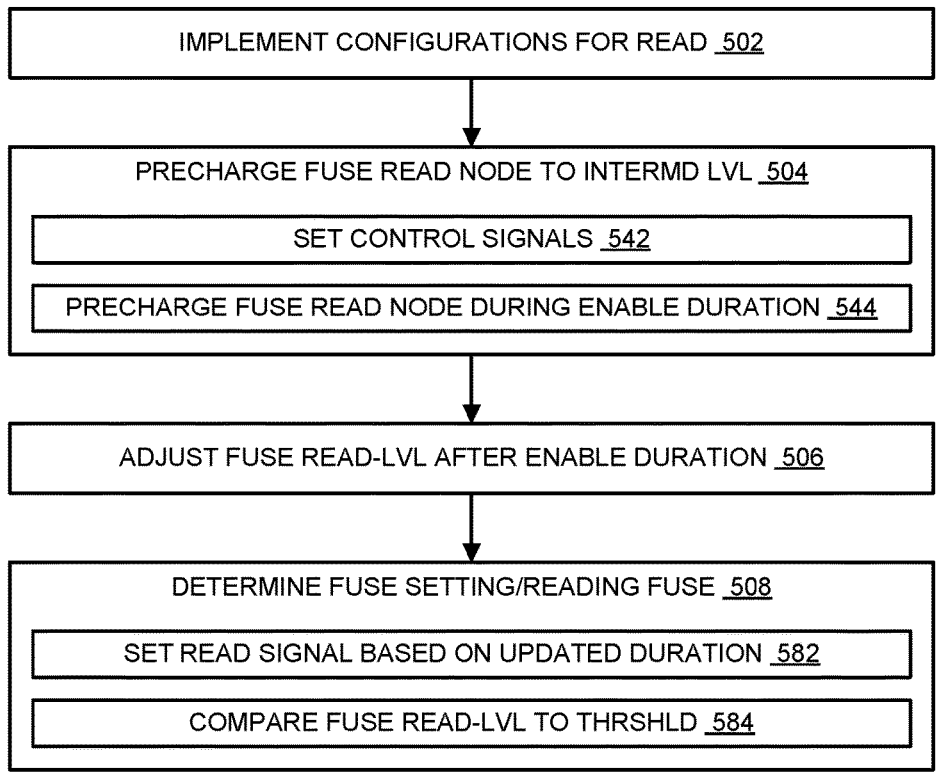
FIG. 5 illustrates an example method of operating an electronic system in accordance with embodiments of the present technology.

FIG. 5 illustrates an example method 500 of operating an electronic system in accordance with embodiments of the present technology. The method 500 can be for operating the electronic device 300 of FIG. 3, such as by precharging the fuse read node 321 of FIG. 3 to the intermediate level 432 of FIG. 4 that is less than the input source level 434 of FIG. 4.

At block 502, the electronic device 300 (e.g., using control circuitry therein or the fuse read circuit 320 of FIG. 3) can configure components or circuits therein for reading one or more fuse cells. For example, the electronic device 300 can configure or operate the fuse transistor 306 of FIG. 3, the selection circuit 310 of FIG. 3, or a combination thereof to connect one or more instances of the fuse cell 304 of FIG. 3 in the fuse array 302 to the fuse read circuit 320 for the reading the information stored in the cells (e.g., based on determining the programmed settings of the fuses). Also for example, the electronic device 300 can configure or select a power supply or the input source level 434 (e.g., such as using the high-input selection signal 330 of FIG. 3 or the granular-input selection signal 332 of FIG. 3).

At block 504, the electronic device 300 can precharge the fuse read node 321 to the intermediate level 432 that is less than the input source level 434. For example, the selection circuit 310 can set the fuse read-level 322 of FIG. 3 to the intermediate level 432 (e.g., based on the precharging signal 326 of FIG. 3 that is at or within a threshold range of the reading threshold 422 of FIG. 4).

At block 542, the electronic device 300 (e.g., using a control circuit, the fuse read circuit 320, or a combination thereof) can set or initiate control signals for precharging the fuse read node 321 and for reading the connected fuse cell. For example, the electronic device 300 can activate (e.g., based on driving the signal low for beginning a negative pulse) the read-lock signal 334 of FIG. 3, the precharging signal 326, or a combination thereof. The electronic device 300 can activate the precharging signal 326 for the enable duration 212 of FIG. 4 (e.g., based on driving the signal high for ending the negative pulse).

At block 544, the electronic device 300 can precharge the fuse read node 321 during the enable duration 212. The electronic device 300 can precharge using the intermediate precharging device 324 of FIG. 4 configured to provide the intermediate level 432 instead of a transistor (e.g., the precharging transistor 124 of FIG. 1) configured to connect the fuse read node 321 to a source providing the input source level 434. For example, the electronic device 300 can precharge using an inverter with an input and an output thereof directly connected to the fuse read node 321. The intermediate precharging device 324 (e.g., the inverter) can be configured to receive the precharging signal 326 that is set to or within a predetermined range of the intermediate level 432. The intermediate precharging device 324 can set the fuse read-level 322 (e.g., the voltage at the fuse read node 321) to match the precharging signal 326 (e.g., based on driving the fuse read-level 322 using the precharging signal 326 and/or inverting the precharging signal 326, the fuse read-level 322, or a combination thereof). In some embodiments, the precharging signal 326 can be preset to match the reading threshold 422 or within a threshold range from the reading threshold 422. The precharging signal 326, and thereby the intermediate level 432, can be at a voltage level closer to the reading threshold 422 than the input source level 434.

At block 506, the electronic device 300 can adjust the fuse read-level 322 after the enable duration 212. The electronic device 300 can adjust the fuse read-level 322 based on removing the influence/input from the intermediate precharging device 324 (e.g., based on driving the precharging signal 326 high at the end of the enable duration 212). Without the influence/input from the intermediate precharging device 324, the fuse read-level 322 can adjust according to the programmed setting of the connected fuse cell, the connected power source, or a combination thereof. For example, the fuse read-level 322 can decrease from the initial precharged level (e.g., the intermediate level 432) when the fuse setting of the connected fuse cell is blown or programmed. The fuse read-level 322 can decrease based on dissipating the charge or the energy at the fuse read node 321 through the lower resistance path (e.g., caused by the intentional setting to the oxide layer). Also for example, the fuse read-level 322 can increase from the initial precharged voltage level when the fuse setting is open or unprogrammed. The fuse read-level 322 can increase based on the connected power supply pulling the fuse read-level 322 up, which can be further maintained based on the high resistance (e.g., caused by the original oxide layer that is without any programmed setting) between the node and lower potential nodes (e.g., ground or '$V_{ss}$').

At block 508, the electronic device 300 (e.g., using the selection circuit 310) can determine the fuse setting and read the information stored in the fuse. The electronic device 300 can determine the information from the fuse cell 304 based on changes or deviation in the fuse read-level 322 (e.g., at the fuse read node 321) from the precharged intermediate level 432. The electronic device 300 can adjust the fuse read-level 322 during the updated duration 416 of FIG. 6 (e.g., a duration less than or equal to the reading duration 214 of FIG. 2 that is associated with precharging the fuse read node 321 to the input source level 234) after the enable duration 212.

At block 582, the electronic device 300 can set the read signal based on the updated duration 416. For example, the electronic device 300 can deactivate the read-lock signal 334 (e.g., based on driving the signal high for ending the negative pulse) at the end of the updated duration 416. The fuse read circuit 320 can determine the fuse setting based on deactivating the read-lock signal 334.

At block 584, the electronic device 300 can compare the fuse read-level 322 to the reading threshold 422 to determine the fuse setting. For example, the fuse read circuit 320 can detect the fuse read-level 322 at the fuse read node 321 after the updated duration 416. The fuse read circuit 320 can determine the fuse setting based on comparing the fuse read-level 322 to the reading threshold 422. As illustrated in FIGS. 4A-4C, the fuse-read output 338 of FIG. 3 can be low when the fuse read-level 322 is below the reading threshold 422 to represent a blown fuse that pulls down the fuse read-level 322 from the intermediate level 432 (e.g., from or within a threshold range from the reading threshold 422). Further, the fuse-read output 338 can be high when the fuse read-level 322 is above the reading threshold 422 to represent an unblown fuse that pulls up the fuse read-level 322 from the intermediate level 432.

Figure 6:
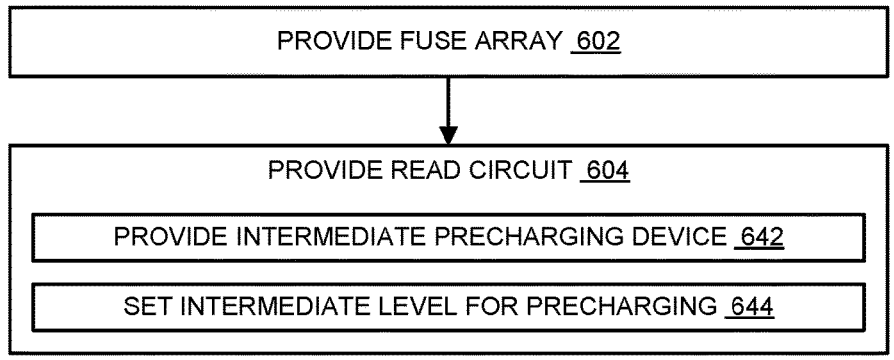
FIG. 6 illustrates an example method of manufacturing an electronic device in accordance with embodiments of the present technology.

FIG. 6 illustrates an example method 600 of manufacturing an electronic device in accordance with embodiments of the present technology. The method 600 can be for manufacturing the electronic device 300 of FIG. 3.

At block 602, the fuse array 302 of FIG. 3 can be provided. The fuse array 302 can include multiple instances of the fuse cell 304 of FIG. 3 that are configured to store information based on their programmed settings. The fuse array 302 can be physically located at a particular or central portion of the electronic device 300.

In some embodiments, the fuse array 302 can include anti-fuses (e.g., gate oxide fuses) that each include the fuse transistor 306 of FIG. 3 and the setting circuit 308 of FIG. 3. The anti-fuses can be set or programmed (e.g., for blown fuses) based on providing a first resistance level (e.g., a relative low resistance targeting an electrical short to a ground or a lower potential node), such as by damaging the setting circuit 308 (e.g., an electrical insulator, such as the oxide layer). The anti-fuses can be unprogrammed based on providing a second resistance level (e.g., a relative high resistance targeting an electrical open) that is higher than the first resistance level (e.g., greater by one or more orders of magnitude, such as by a factor of 1,000 or more). The programmed anti-fuses can reduce the fuse read-level 322 below the intermediate level 432 that occurs at the precharging operation, and the unprogrammed anti-fuses can increase the fuse read-level 322 above the intermediate level 432.

In some embodiments, providing the fuse array 302 can include forming the integrated circuitry in semiconductor layers (e.g., during formation of the semiconductor die). In some embodiments, providing the fuse array 302 can include assembling or connecting circuit components. In some embodiments, providing the fuse array 302 can include programming and/or testing fuse cells in the fuse array 302 with the desired settings.

At block 604, the fuse read circuit 320 of FIG. 3 can be provided. The fuse read circuit 320 can be configured to determine the programmed setting of the connected fuse cell based on precharging to the intermediate level 432 instead of the input source level 434. The fuse read circuit 320 can determine the programmed setting based on changes or adjustments in the precharged voltage level according to the programmed setting of the connected fuse cell.

The fuse read circuit 320 can include, for example, the intermediate precharging device 324 of FIG. 3 (e.g., an inverter), the input selection transistors 328 of FIG. 3, etc. The intermediate precharging device 324 can be configured to precharge the fuse read-level 322 of FIG. 3 to the intermediate level 432. The input selection transistors 328 can be configured to set or select the input source level 434 for adjusting the fuse read-level 322 after precharging to the intermediate level 432.

In providing the fuse read circuit 320, the fuse read circuit 320 can be connected to the fuse array 302 through the selection circuit 310 of FIG. 3. The electrical connection between the fuse read circuit 320 and the fuse array 302 (e.g., with the selection circuit 310) can form the fuse read node 321 of FIG. 3. The fuse read node 321 can be electrically coupled to the input source level 434 (e.g., as set or selected by the input selection transistors 328) through the fuse cell 304 selected by the selection circuit 310 and the fuse transistor 306.

The provided fuse read circuit 320 can include the intermediate precharging device 324 that is configured to adjust the fuse read-level 322 at the fuse read node 321 to the intermediate level 432 that is less than the input source level 434. The intermediate precharging device 324 can be a device different from transistors that are configured to connect the fuse read node 321 to the input source (e.g., for '$V_{cc}$'). For example, the intermediate precharging device 324 can include an inverter with its input and output directly connected to the fuse read node 321 (e.g., for stabilizing a voltage level at the fuse read node 321). The intermediate precharging device 324 can further receive and utilize the precharging signal 326 (e.g., set to the intermediate level 432 that is equal to or within a threshold range from the reading threshold 422) to precharge the fuse read-level 322 to the intermediate level 432 (e.g., a voltage level closer to the reading threshold 422 than the input source level 434).

The fuse read circuit 320 can be configured to precharge the fuse read node 321 during the enable duration 212 of FIG. 4. After the enable duration 212, the fuse read circuit 320 can allow the fuse read-level 322 to be adjusted according to the programmed setting (e.g., reducing for blown fuses and increasing for unblown fuses) of the connected fuse cell. The fuse read circuit 320 can adjust the fuse read-level 322 for the updated duration 416 of FIG. 4 after the enable duration 212. The updated duration 416 can be equal to or less than the reading duration 214 of FIG. 2 associated with reading the fuse cells based on precharging to the input source level 234.

After the updated duration 416, the fuse read circuit 320 can determine the programmed setting of the connected fuse based on comparing the fuse read-level 322 to the reading threshold 422. For example, the fuse read circuit 320 can generate the fuse-read output 338 of FIG. 3 based on the comparison as discussed above.

In some embodiments, providing the fuse read circuit 320 can include forming the integrated circuitry in semiconductor layers (e.g., during formation of the semiconductor die). In some embodiments, providing the fuse read circuit 320 can include assembling or connecting circuit components. In some embodiments, providing the fuse read circuit 320 can include setting the precharging signal 326 to the intermediate level 432 that is the same as or within a threshold range of the reading threshold 422.

Figure 7:
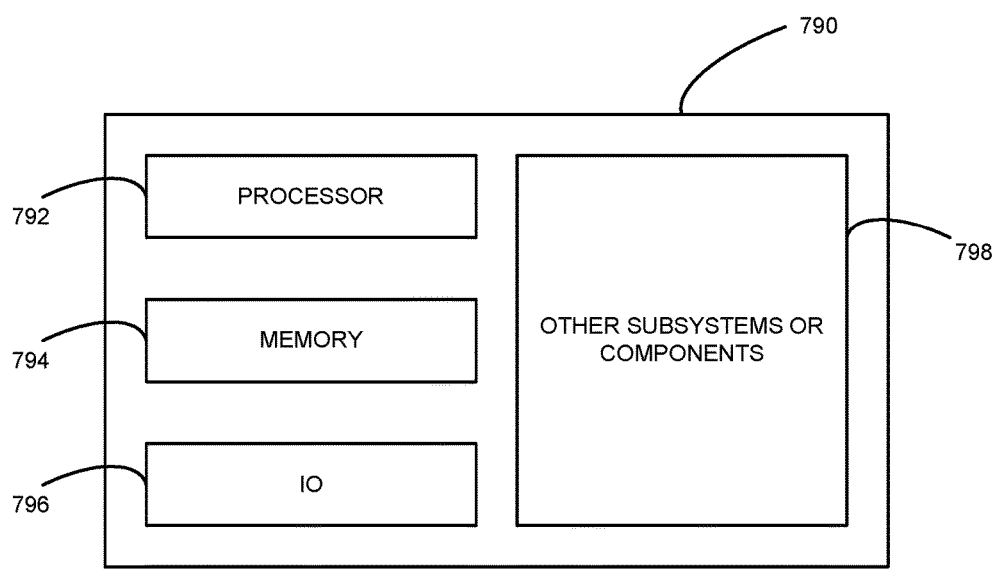
FIG. 7 is a schematic view of a system that includes an electronic device in accordance with embodiments of the present technology.

FIG. 7 is a schematic view of a system that includes an electronic device in accordance with embodiments of the present technology. Any one of the semiconductor devices having the features described above with reference to FIGS. 3-6 can be incorporated into any of a myriad of larger and/or more complex systems, a representative example of which is system 790 shown schematically in FIG. 7. The system 790 can include a processor 792, a memory 794 (e.g., SRAM, DRAM, flash, and/or other memory devices), input/output devices 796, and/or other subsystems or components 798. The semiconductor assemblies, devices, and device packages described above with reference to FIGS. 3-6 can be included in any of the elements shown in FIG. 7. The resulting system 790 can be configured to perform any of a wide variety of suitable computing, processing, storage, sensing, imaging, and/or other functions. Accordingly, representative examples of the system 790 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 790 include lights, cameras, vehicles, etc. With regard to these and other examples, the system 790 can be housed in a single unit or distributed over multiple interconnected units, e.g., through a communication network. The components of the system 790 can accordingly include local and/or remote memory storage devices and any of a wide variety of suitable computer-readable media.

From the foregoing, it will be appreciated that specific embodiments of the present technology have been described herein for purposes of illustration, but that various modifications may be made without deviating from the disclosure. In addition, certain aspects of the disclosure described in the context of particular embodiments may be combined or eliminated in other embodiments. Further, while advantages associated with certain embodiments have been described in the context of those embodiments, other embodiments may also exhibit such advantages. Not all embodiments need necessarily exhibit such advantages to fall within the scope of the present disclosure. Accordingly, the disclosure and associated technology can encompass other embodiments not expressly shown or described herein.

We claim:

1. A method of operating an electronic device, comprising:
    precharging a fuse read node to an intermediate voltage less than an input voltage, wherein the fuse read node connects a fuse array and a fuse read circuit, the fuse array including a fuse cell configured to store information and the fuse read circuit configured to read the stored information,
        wherein precharging the fuse read node includes precharging the fuse read node with an intermediate precharging device configured to provide the intermediate voltage instead of a transistor configured to connect the fuse read node to a source providing the input voltage;
    connecting the fuse cell to the fuse read node for reading the information; and
    determining, with the fuse read circuit, the information from the fuse cell based on changes to the intermediate voltage at the fuse read node.

2. The method of claim 1, wherein precharging includes charging the fuse read node to the intermediate voltage during an enable duration before reading the information.

3. The method of claim 2, further comprising adjusting a fuse read voltage at the fuse read node based on a connection between the fuse read node and the fuse cell after precharging the fuse read node to the intermediate voltage.

4. The method of claim 3, wherein adjusting the fuse read voltage includes reducing the fuse read voltage from the intermediate voltage based on a fuse setting of the fuse cell.

5. The method of claim 3, wherein adjusting the fuse read voltage includes increasing the fuse read voltage from the intermediate voltage based on a fuse setting of the fuse cell.

6. The method of claim 2, wherein determining the information includes detecting a fuse read voltage at the fuse read node after an updated duration, wherein the updated duration is less than a reading duration associated with precharging the fuse read node to the input voltage.

7. The method of claim 1, wherein:
    precharging the fuse read node includes precharging the fuse read node to the intermediate voltage closer to a reading threshold than the input voltage, wherein the reading threshold is a trip point of an intermediate inverter configured to invert a voltage state at the fuse read node; and
    determining the information includes comparing a voltage at the fuse read node to the reading threshold.

8. The method of claim 1, wherein the intermediate precharging device includes an inverter with an input and an output thereof directly connected to the fuse read node and configured to receive the intermediate voltage for adjusting a voltage at the fuse read node to the intermediate voltage.

9. The method of claim 1, wherein:
    the fuse array includes one or more sets of anti-fuses located at a specific portion within the electronic device; and
    connecting the fuse cell includes connecting an anti-fuse to the fuse read node, wherein the anti-fuse includes a setting circuit configured to provide an electrical open or a first resistance level when it is not programmed and provide an electrical short or a second resistance level that is lower than the first resistance level when it is programmed or in a fuse-blown setting.

10. An electronic device, comprising:
    a fuse array including a fuse cell configured to store information; and
    a fuse read circuit connected to the fuse array at a fuse read node, the fuse read circuit including an intermediate precharging device that is configured to adjust a fuse read voltage at the fuse read node to an intermediate voltage less than an input voltage,
        wherein the fuse read circuit is configured to read the information stored in the fuse cell based on changes in the fuse read voltage from the intermediate voltage from connecting the fuse read node to the fuse cell, and
        wherein the intermediate precharging device is an inverter.

11. The electronic device of claim 10, wherein the inverter includes an input and an output directly connected to the fuse read node.

12. The electronic device of claim 11, wherein:
    the inverter is configured to precharge the fuse read node to the intermediate voltage closer to a reading threshold than the input voltage; and
    the fuse read circuit is configured to read the information based on comparing the fuse read voltage to the reading threshold.

13. The electronic device of claim 10, wherein the fuse cell includes an anti-fuse configured to provide an electrical open or a first resistance level when it is not programmed and provide an electrical short or a second resistance level that is lower than the first resistance level when it is programmed or in a fuse-blown setting.

14. The electronic device of claim 13, wherein the anti-fuse is configured to reduce the fuse read voltage below the intermediate voltage when it is programmed.

15. The electronic device of claim 13, wherein the anti-fuse is configured to increase the fuse read voltage above the intermediate voltage when it is not programmed.

16. The electronic device of claim 13, wherein the anti-fuse includes a fuse transistor and an oxide layer, wherein the fuse transistor is configured to select the fuse cell and the oxide layer is configured to provide the first resistance level or the second resistance level based on programming.

17. The electronic device of claim 10, further comprising an input selection circuit configured to set the input voltage for adjusting the fuse read voltage after precharging to the intermediate voltage, wherein the input voltage is coupled to the fuse read node through the fuse cell.

18. The electronic device of claim 10, further comprising a fuse selection circuit configured to electrically connect the fuse cell to the fuse read circuit.

* * * * *